(12) United States Patent
Johnson et al.

(10) Patent No.: US 9,196,962 B2
(45) Date of Patent: Nov. 24, 2015

(54) DIFFERENTIAL LOOPSTICK ANTENNA CONFIGURATION

(75) Inventors: Michael S. Johnson, Austin, TX (US); Russell Croman, Austin, TX (US); Scott D. Willingham, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 469 days.

(21) Appl. No.: 13/468,837

(22) Filed: May 10, 2012

(65) Prior Publication Data

US 2013/0303102 A1 Nov. 14, 2013

(51) Int. Cl.
| | |
|---|---|
| *H04B 1/06* | (2006.01) |
| *H04B 7/00* | (2006.01) |
| *H04B 1/18* | (2006.01) |
| *H01Q 7/00* | (2006.01) |
| *H03F 3/45* | (2006.01) |

(52) U.S. Cl.
CPC .............. *H01Q 7/00* (2013.01); *H03F 3/45475* (2013.01); *H04B 1/18* (2013.01); *H03F 2200/294* (2013.01)

(58) Field of Classification Search
USPC .............. 455/41.1, 41.2, 41.3, 280, 292, 269, 455/272, 273, 274, 277.1, 277.2
See application file for complete search history.

(56) References Cited

U.S. PATENT DOCUMENTS

| | | | | |
|---|---|---|---|---|
| 4,542,532 | A  * | 9/1985 | McQuilkin | 455/78 |
| 2005/0107043 | A1* | 5/2005 | Avasarala et al. | 455/78 |
| 2009/0124223 | A1* | 5/2009 | Kyranas et al. | 455/143 |
| 2011/0065383 | A1* | 3/2011 | Frankland et al. | 455/41.1 |
| 2012/0007787 | A1* | 1/2012 | Schantz et al. | 343/788 |
| 2012/0142286 | A1* | 6/2012 | Mitomo et al. | 455/82 |
| 2012/0235878 | A1* | 9/2012 | Mitomo et al. | 343/860 |

* cited by examiner

*Primary Examiner* — Nguyen Vo
(74) *Attorney, Agent, or Firm* — Abel Law Group, LLP

(57) ABSTRACT

A long-wave or medium-wave receiver receives a first signal from a first terminal of a loopstick antenna on a positive antenna input terminal of the receiver and receives a second signal from a second terminal of the loopstick antenna on a negative antenna input terminal of the receiver. The first and second signals are processed differentially in the receiver. The receiver may optionally be configured to operate in either a differential mode or a single-ended mode by setting switches to selectively connect one of the antenna input terminals to ground in single-ended mode.

15 Claims, 3 Drawing Sheets

US 9,196,962 B2

DIFFERENTIAL LOOPSTICK ANTENNA CONFIGURATION

BACKGROUND

1. Field of the Invention

This invention relates to the interface between antennas and radio frequency (RF) receivers and more particularly to receivers associated with loopstick antennas.

2. Description of the Related Art

Loopstick antennas are frequently used with amplitude modulated (AM) receivers. A loopstick antenna is formed by a wire loop. Usually, wire is wound around a metal rod (typically ferrite). Loopstick antennas have traditionally had one terminal of the antenna coupled to the receiver and the other terminal coupled to ground.

SUMMARY OF EMBODIMENTS OF THE INVENTION

In an embodiment, an apparatus includes an integrated circuit that has a positive antenna input terminal; a negative antenna input terminal; and an amplifier coupled to the positive and negative antenna input terminals to amplify a difference between a first signal on the positive antenna input from a first terminal of a loopstick antenna and a second signal from a second terminal of the loopstick antenna received on the negative antenna input terminal.

In another embodiment, a method of operating an RF receiver includes receiving a first signal from a first terminal of a loopstick antenna on a positive antenna input terminal of a receiver. A second signal is received from a second terminal of the loopstick antenna on a negative antenna input terminal of the receiver. The difference between the first and second signal is amplified.

In still another embodiment, a method includes operating a front end of a receiver in a single-ended mode or a differential mode with respect to first and second antenna inputs according to settings of a first and a second switch, the first switch disposed between the first antenna input and a reference potential and the second switch disposed between the second antenna input and the reference potential. The first and second switches are set to respectively disconnect the first antenna input and the second antenna input from the reference potential to operate the receiver in the differential mode. In order to operate the receiver in the single-ended mode, either the first switch is closed to couple the positive antenna input to the reference voltage or the second switch is closed to couple the negative antenna input to the reference voltage.

In still another embodiment, an apparatus includes a positive antenna input terminal and a negative antenna input terminal. A first switch is disposed between the positive antenna input and a reference voltage node to selectively couple the positive antenna input to the reference voltage node and a second switch disposed between the negative antenna input and the reference voltage to selectively couple the negative antenna input to the reference voltage node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
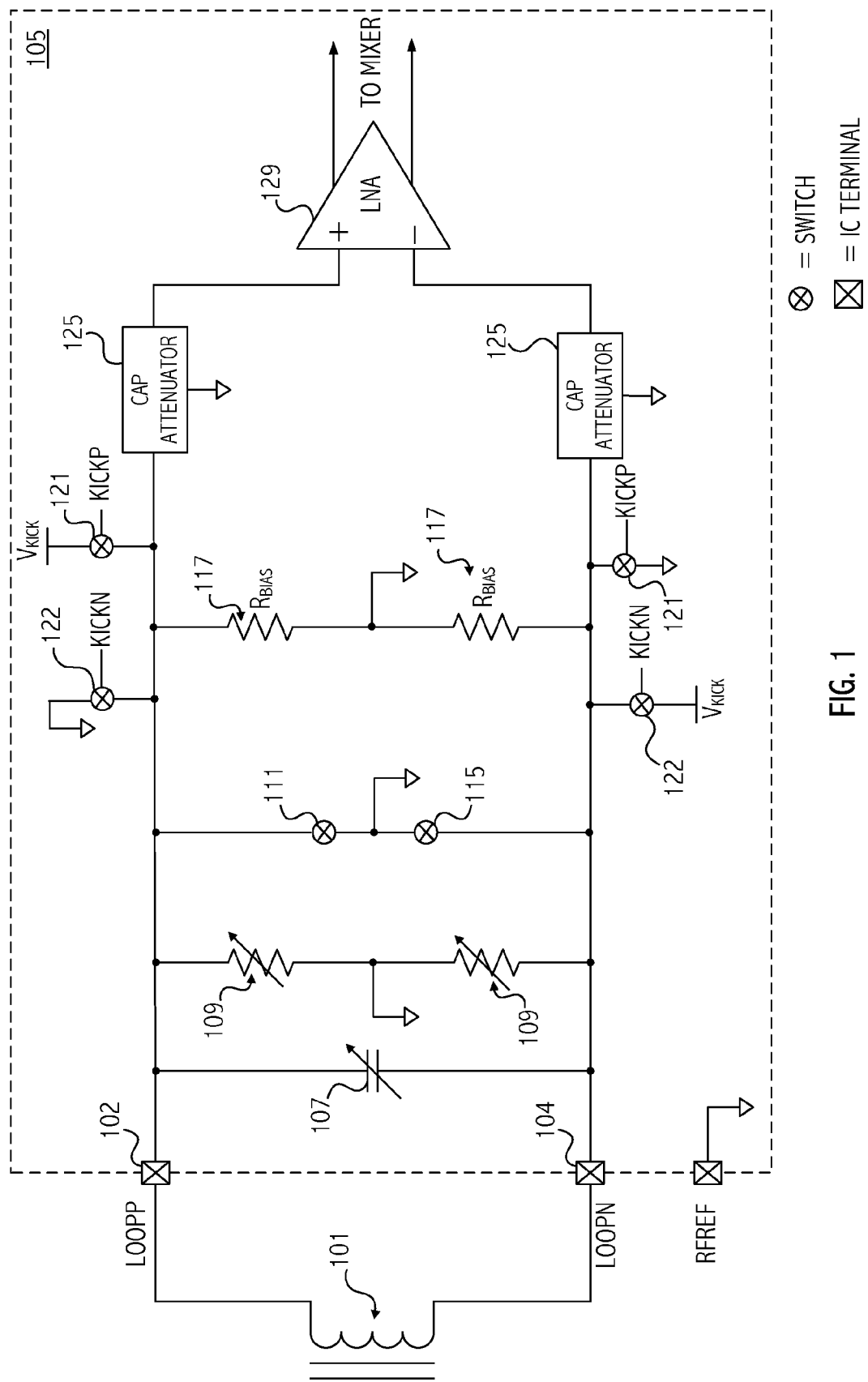
FIG. 1 illustrates a system including a loopstick antenna coupled to differential inputs of a receiver.

A radio frequency (RF) receiver having a differential input for the loopstick antenna provides noise/interference suppression along with even-order harmonic distortion cancellation. FIG. 1 illustrates an example of a loopstick antenna 101 coupled to differential input terminals 102 and 104 of a front end of receiver 105. The RF receiver may be, e.g., for reception of long-wave (LW) or medium-wave (MW) transmissions. The receiver may be an amplitude modulated (AM) receiver for LW or MW AM transmissions. The differential inputs 102 and 104 are labeled LOOPP (positive) and LOOPN (negative). A variable capacitor (varactor) 107 is connected across the differential inputs. This variable capacitor 107 is adjusted until the resonance is at the desired channel. The resistances 109 associated with the tank circuit may be set to provide attenuation to the received signal. Bias resistors 117 are connected to the RF reference voltage (e.g., ground). Both resistances 109 and 117 introduce common-mode rejection. Providing common-mode rejection may be particularly useful for dealing with 60/50 Hz line noise. If the resistances 109 are set to provide the bias resistance, separate bias resistors 117 may be omitted. The "kick" circuits 121 or 122 may be used to excite the tank during the tuning operation by adding voltage to the tank circuit to verify the varactor setting. The kick circuit 121 may be used when, e.g., a loopstick antenna is connected in a single-ended configuration to input 102 and the kick circuit 122 may be used, when, e.g., a loopstick antenna is connected in a single-ended configuration to input 104. The single ended configurations are explained in more detail below. The resistive attenuators 109 are also connected to ground so that any common-mode signals are further attenuated. Note that a particular ordering of the various functions described is not necessary. The capacitive attenuator 125 can attenuate the signal if required, without degrading the quality factor Q of the tank circuit as would the resistive attenuators. The low noise amplifier (LNA) 129 amplifies the differential signal and supplies the amplified signal to a mixer (not shown) for conventional RF processing.

Figure 2:
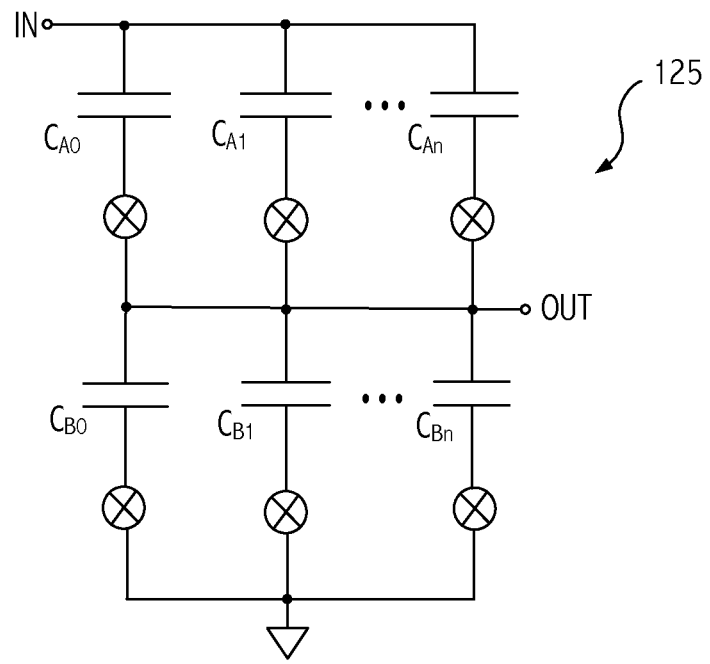
FIG. 2 illustrates an exemplary capacitive attenuator that may be used in the embodiment of FIG. 1.
Figure 3:
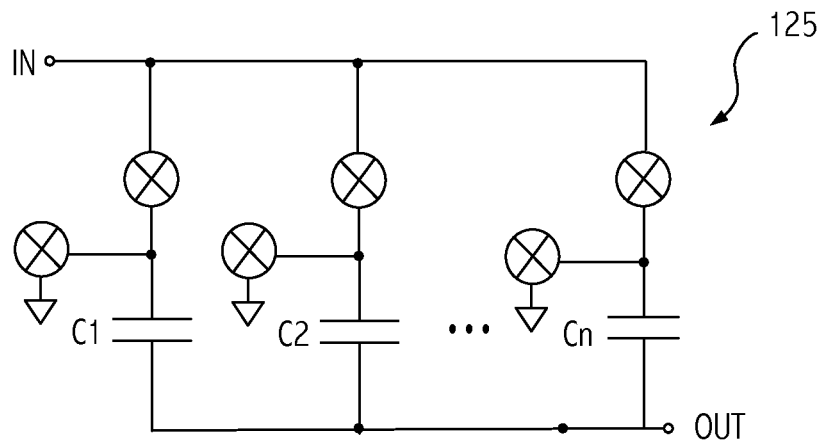
FIG. 3 illustrates an exemplary capacitive attenuator that may be used in the embodiment of FIG. 1.

FIGS. 2 and 3 illustrate various possible implementations of the capacitive attenuator 125. Other implementations are of course possible. The number of capacitors will be determined by the needs of the particular application. In some implementations binary weighted capacitors may be used.

Figure 4:
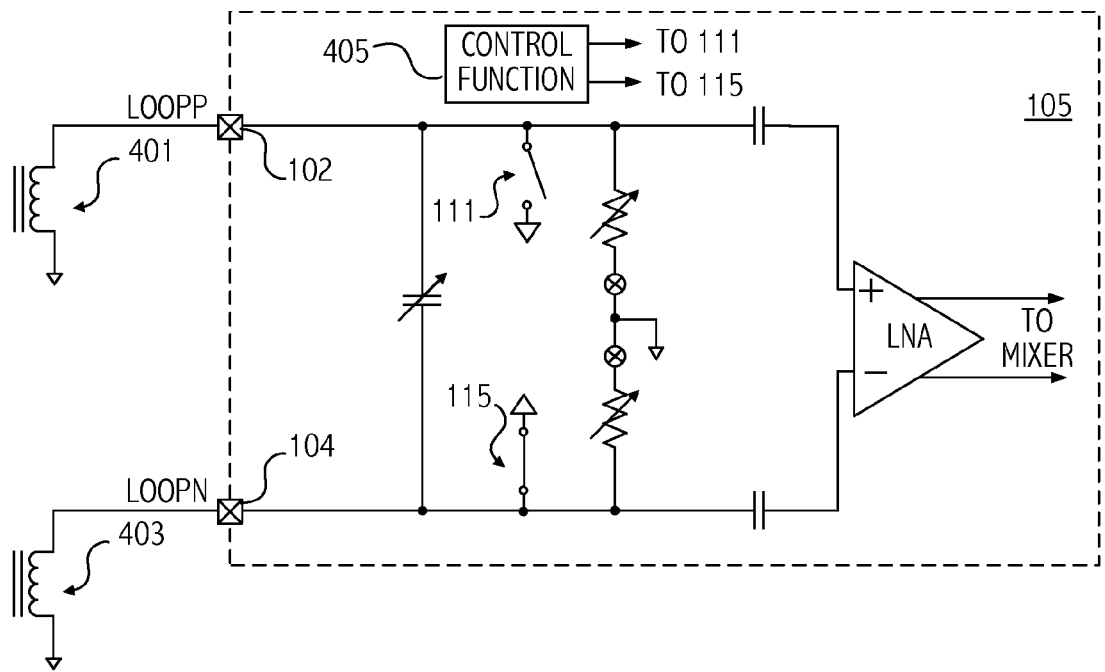
FIG. 4 illustrates the receiver of FIG. 1 in an embodiment with two antennas, one coupled to the positive antenna input and one coupled to the negative antenna input and the negative antenna input coupled to a reference potential in a single-ended configuration receiver configuration.
Figure 5:
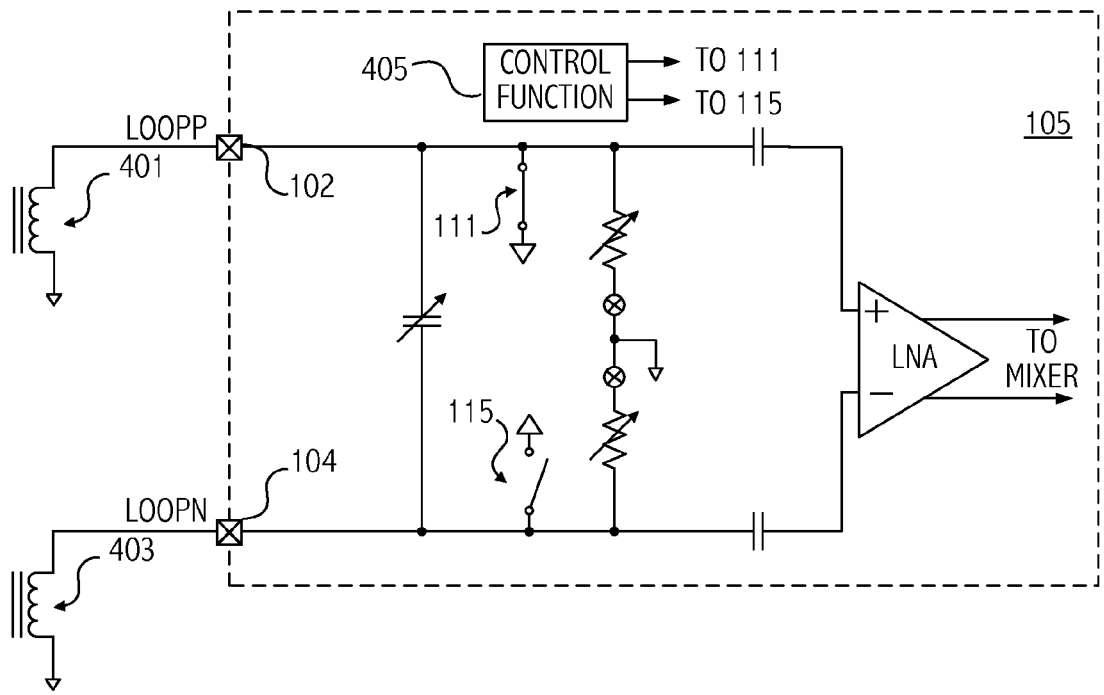
FIG. 5 illustrates the receiver of FIG. 1 in an embodiment with two antennas, one coupled to the positive antenna input and one coupled to the negative antenna input and the positive antenna input coupled to a reference potential in a single-ended configuration receiver configuration.

The front end of the receiver 105 includes switches 111 and 115 that allow for selecting between two antennas for a single-ended mode of operation. FIG. 4 and FIG. 5 illustrate how switches 111 and 115 may be utilized in a single-ended mode rather than the differential mode shown in FIG. 1. Referring to FIG. 4, assume that two loopstick antennas 401 and 403 are coupled to the inputs 102 and 104 of receiver 105. The loopstick antennas 401 and 403 may be configured such that they are orthogonal to each other to complement the reception differences between the antennas. The antenna with the best reception may be selected as the loopstick antenna to use. The received signal may be determined, e.g., by the received signal strength, or other metric indicating quality of reception. That quality metric may be evaluated and the antennas selected periodically when the station is first selected, when the received signal strength or other metric falls below a threshold value, or when any combination of these or other events occur. A control function 405, implemented, e.g., in a microcontroller or other control logic in the receiver, may be configured to evaluate the signal strength and to update the antenna selection by providing control signals for switches 111 and 115 in accordance with the quality metric and evaluation timing described above. In other embodiments, only a single loopstick antenna is used in single-ended mode that connects to one of the antenna inputs 102 and 104, while the other antenna input remains connected to the reference voltage. In such a configuration with only one antenna in a single-ended implementation, the switches may be pin programmable or programmed from non-volatile memory or from controller 405.

Referring to FIGS. 4 and 5, with switch 115 closed, the negative loop (LOOPN) of the differential embodiment is shorted to the radio frequency (RF) reference voltage (which typically is a local RF ground). That allows antenna 401 to be used for RF reception. Alternatively, switch 111 may be closed to short the positive loop LOOPP to ground allowing the loopstick antenna 403 coupled to pin 104 to be used as a single-ended antenna input to the front end of receiver 105.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method comprising:
   operating a front end of a receiver in a single-ended mode or a differential mode with respect to a first and a second antenna input according to settings of a first and a second switch, the first switch disposed between the first antenna input and a reference potential and the second switch disposed between the second antenna input and the reference potential;
   setting the first and second switch to respectively disconnect the first antenna input and the second antenna input from the reference potential to operate the receiver in the differential mode; and
   selectively closing the first switch to couple the first antenna input to the reference voltage or selectively closing the second switch to couple the second antenna input to the reference voltage, to configure the front end of the receiver to receive signals from one of a first loopstick antenna coupled at one of the first and second antenna inputs and a second loopstick antenna coupled at the other of the first and second antenna inputs to operate the receiver in the single-ended mode.

2. The method as recited in claim 1 further comprising:
   operating the front end of the receiver in the differential mode by receiving a first and a second signal from first and second terminals of a loopstick antenna respectively connected to the first and second antenna inputs; and amplifying a difference between the first and second signals.

3. The method as recited in claim 2 further comprising varying a capacitive circuit coupled between the first antenna input and the second antenna input to achieve a desired resonance.

4. The method as recited in claim 1 further comprising operating the front end of the receiver in the single-ended mode by receiving signals from the first loopstick antenna at one of the first and second antenna inputs and coupling the other of the first and second antenna inputs to the reference voltage.

5. The method as recited in claim 1 wherein the first loopstick antenna and the second loopstick antenna are coupled respectively to the first and second antenna inputs and the first and second loopstick antennas are oriented orthogonally to each other.

6. The method as recited in claim 5 further comprising selecting to use one of the first and second loopstick antennas according to which of the antennas provides a better signal.

7. The method as recited in claim 1 further comprising:
   when operating the receiver in the differential mode, attenuating common mode signals present on the first and second antenna input utilizing a first bias resistance coupled between the first antenna input and a reference voltage node and a second bias resistance coupled between the second antenna input and the reference voltage node.

8. An apparatus comprising:
   a positive antenna input;
   a negative antenna input;
   a first switch disposed between the positive antenna input and a reference voltage node to selectively couple the positive antenna input to the reference voltage node and a second switch disposed between the negative antenna input and the reference voltage node to selectively couple the negative antenna input to the reference voltage node,
   wherein one of the first and second switches is configured to couple the positive antenna input or the negative antenna input to the reference voltage node to operate the apparatus in a single-ended mode with respect to the positive and negative antenna inputs,
   wherein in the single-ended mode, the first and second switches are configured to couple a front end of the receiver to receive signals from one of a first loopstick antenna coupled at one of the positive and negative antenna inputs and a second loopstick antenna coupled at the other of the positive and negative antenna inputs.

9. The apparatus as recited in claim 8 further comprising the first and second loopstick antennas coupled, respectively, to the positive and negative antenna inputs.

10. The apparatus as recited in claim 9 wherein the first and second loopstick antennas are oriented orthogonally to each other.

11. The apparatus as recited in claim 8 further comprising:
   an amplifier having a first amplifier input and a second amplifier input coupled respectively to the positive and negative antenna inputs to amplify a difference, when the apparatus is configured in a differential mode of operation, between a first signal received from a first terminal of a loopstick antenna on the positive antenna input and a second signal received from a second terminal of the loopstick antenna received on the negative antenna input.

12. The apparatus as recited in claim 11 further comprising the loopstick antenna coupled to the positive antenna input at the first terminal and the negative antenna input at the second terminal.

13. The apparatus as recited in claim 11 wherein the amplifier is part of a long-wave or medium-wave receiver.

14. The apparatus as recited in claim 8 further comprising a first bias resistor coupled between the positive antenna input and a reference voltage node and a second bias resistor coupled between the negative antenna input and the reference voltage node.

15. The apparatus as recited in claim 8 further comprising a first capacitive attenuator circuit coupled to the positive antenna input and a second capacitive attenuator circuit coupled to the negative antenna input.

* * * * *